United States Patent
Lin et al.

(10) Patent No.: US 11,574,907 B2
(45) Date of Patent: Feb. 7, 2023

(54) ENHANCED CHANNEL STRAIN TO REDUCE CONTACT RESISTANCE IN NMOS FET DEVICES

(71) Applicant: TAIWAN SEMICONDUCTOR MANUFACTURING CO., LTD., Hsinchu (TW)

(72) Inventors: Yu-Chang Lin, Hsinchu (TW); Chun-Feng Nieh, Hsinchu (TW); Huicheng Chang, Tainan (TW); Hou-Yu Chen, Zhubei (TW); Yong-Yan Lu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 162 days.

(21) Appl. No.: 17/170,601

(22) Filed: Feb. 8, 2021

(65) Prior Publication Data
US 2021/0159226 A1 May 27, 2021

Related U.S. Application Data

(60) Continuation of application No. 16/725,553, filed on Dec. 23, 2019, now Pat. No. 10,916,546, which is a
(Continued)

(51) Int. Cl.
*H01L 27/092* (2006.01)
*H01L 29/78* (2006.01)
(Continued)

(52) U.S. Cl.
CPC ...... *H01L 27/0924* (2013.01); *H01L 21/0262* (2013.01); *H01L 21/02529* (2013.01);
(Continued)

(58) Field of Classification Search
CPC ............... H01L 27/0924; H01L 21/845; H01L 29/7846; H01L 21/0262; H01L 21/823878;
(Continued)

(56) References Cited

U.S. PATENT DOCUMENTS 6,107,129 A 8/2000 Gardner et al.
7,625,790 B2 12/2009 Yang
(Continued)

OTHER PUBLICATIONS

Non-Final Office Action U.S. Appl. No. 14/859,165 dated Jul. 18, 2016.
(Continued)

*Primary Examiner* — Victor A Mandala
(74) *Attorney, Agent, or Firm* — McDermott Will & Emery LLP

(57) ABSTRACT

A semiconductor device includes a substrate, a fin structure and an isolation layer formed on the substrate and adjacent to the fin structure. The semiconductor device includes a gate structure formed on at least a portion of the fin structure and the isolation layer. The semiconductor device includes an epitaxial layer including a strained material that provides stress to a channel region of the fin structure. The epitaxial layer has a first region and a second region, in which the first region has a first doping concentration of a first doping agent and the second region has a second doping concentration of a second doping agent. The first doping concentration is greater than the second doping concentration. The epitaxial layer is doped by ion implantation using phosphorous dimer.

20 Claims, 11 Drawing Sheets

Related U.S. Application Data continuation of application No. 16/105,925, filed on Aug. 20, 2018, now Pat. No. 10,515,966, which is a continuation of application No. 15/446,295, filed on Mar. 1, 2017, now Pat. No. 10,056,383, which is a division of application No. 14/859,165, filed on Sep. 18, 2015, now Pat. No. 9,607,838.

(51) Int. Cl.

| | | |
|---|---|---|
| *H01L 29/66* | (2006.01) | |
| *H01L 27/12* | (2006.01) | |
| *H01L 29/49* | (2006.01) | |
| *H01L 29/165* | (2006.01) | |
| *H01L 21/265* | (2006.01) | |
| *H01L 21/8234* | (2006.01) | |
| *H01L 21/8238* | (2006.01) | |
| *H01L 21/02* | (2006.01) | |
| *H01L 21/84* | (2006.01) | |

(52) U.S. Cl.
CPC .... *H01L 21/02532* (2013.01); *H01L 21/2658* (2013.01); *H01L 21/26513* (2013.01); *H01L 21/26586* (2013.01); *H01L 21/26593* (2013.01); *H01L 21/823418* (2013.01); *H01L 21/823431* (2013.01); *H01L 21/823814* (2013.01); *H01L 21/823821* (2013.01); *H01L 21/823878* (2013.01); *H01L 21/845* (2013.01); *H01L 27/1211* (2013.01); *H01L 29/495* (2013.01); *H01L 29/4966* (2013.01); *H01L 29/4975* (2013.01); *H01L 29/6656* (2013.01); *H01L 29/6681* (2013.01); *H01L 29/66545* (2013.01); *H01L 29/66795* (2013.01); *H01L 29/66803* (2013.01); *H01L 29/785* (2013.01); *H01L 29/7842* (2013.01); *H01L 29/7846* (2013.01); *H01L 29/7848* (2013.01); *H01L 29/7851* (2013.01); *H01L 29/7855* (2013.01); *H01L 21/823412* (2013.01); *H01L 21/823807* (2013.01); *H01L 29/165* (2013.01)

(58) Field of Classification Search
CPC ............... H01L 29/495; H01L 29/4966; H01L 29/4975; H01L 21/26513; H01L 27/1211; H01L 29/7851; H01L 29/7855; H01L 21/823814; H01L 21/823418; H01L 29/7848; H01L 21/2658; H01L 21/823821; H01L 21/26586; H01L 29/66545; H01L 29/66803; H01L 21/823431; H01L 21/02532; H01L 21/02529; H01L 29/6681; H01L 21/26593; H01L 29/7842; H01L 29/66795; H01L 29/785; H01L 29/6656; H01L 29/165; H01L 21/823412; H01L 21/823807

See application file for complete search history.

(56) References Cited

U.S. PATENT DOCUMENTS

| | | | |
|---|---|---|---|
| 8,487,378 B2 | 7/2013 | Goto et al. | |
| 8,729,634 B2 | 5/2014 | Shen et al. | |
| 8,809,171 B2 | 8/2014 | Xu et al. | |
| 8,826,213 B1 | 9/2014 | Ho et al. | |
| 8,877,576 B2* | 11/2014 | Knoblinger | H01L 27/092 438/197 |
| 8,887,106 B2 | 11/2014 | Ho et al. | |
| 9,245,805 B2 | 1/2016 | Yeh et al. | |
| 10,056,383 B2 | 8/2018 | Lin et al. | |
| 10,515,966 B2 | 12/2019 | Lin et al. | |
| 11,387,320 B2* | 7/2022 | Murthy | H01L 21/76805 |
| 2004/0258930 A1* | 12/2004 | Moriguchi | H01L 21/0268 428/446 |
| 2006/0060860 A1 | 3/2006 | Yamazaki et al. | |
| 2008/0160683 A1 | 7/2008 | Vanderpool et al. | |
| 2011/0272739 A1* | 11/2011 | Lee | H01L 29/0653 257/E21.409 |
| 2012/0091528 A1* | 4/2012 | Chang | H01L 27/12 257/E21.409 |
| 2012/0115284 A1* | 5/2012 | Chien | H01L 29/66795 438/157 |
| 2013/0221447 A1* | 8/2013 | Lee | H01L 29/6681 257/369 |
| 2013/0267083 A1 | 10/2013 | Suguro | |
| 2013/0341638 A1* | 12/2013 | Liao | H01L 29/66795 257/77 |
| 2014/0054679 A1 | 2/2014 | Tang et al. | |
| 2014/0084369 A1 | 3/2014 | Murthy et al. | |
| 2014/0282326 A1 | 9/2014 | Chen et al. | |
| 2015/0028349 A1* | 1/2015 | Loubet | H01L 29/785 257/190 |
| 2015/0076514 A1* | 3/2015 | Morin | H01L 29/785 257/190 |
| 2015/0137181 A1 | 5/2015 | Basker et al. | |
| 2015/0255604 A1* | 9/2015 | Yang | H01L 21/26533 257/192 |
| 2015/0287711 A1* | 10/2015 | Kim | H01L 21/823431 257/401 |
| 2016/0020150 A1* | 1/2016 | You | H01L 29/66545 438/283 |
| 2016/0155668 A1 | 6/2016 | Yeh et al. | |
| 2016/0190304 A1* | 6/2016 | Morin | H01L 29/66795 438/479 |
| 2016/0359044 A1* | 12/2016 | Bedell | H01L 29/1054 |
| 2017/0033220 A1* | 2/2017 | Fung | H01L 29/7849 |
| 2019/0131122 A1* | 5/2019 | Wang | H01L 21/0223 |

OTHER PUBLICATIONS

Notice of Allowance U.S. Appl. No. 14/859,165 dated Nov. 10, 2016.
M.C. Ozturk et al., "Advanced Si1-xGex Source/Drain and Contact Technologies for Sub-70 um CMOS", IEEE, IEDM, (2002), pp. 375-378.
A. Yagishita et al., "Schottky Barrier Height Reduction and Drive Current Improvement in Metal Source/Drain MOSFET with Strained-Si Channel", Extended Abstracts of the 2003 International Conference on Solid State Devices and Materials, Tokyo, (2003), pp. 708-709.
A. Kinoshita et al., "Solution for High-Performance Schottky-Source/Drain MOSFETs: Schottky Barrier Height Engineering with Dopant Segregation Technique", IEEE, 2004 Symposium on VLSI Technology Digest of Technical Papers, (2004), pp. 168-169.
EE130 Lecture 13 marked-up, Spring 2007, 15 slides.
Y. Tsuchiya et al., "Physical mechanism of effective work function modulation caused by impurity segregation at Ni sillcide/ SiO 2 interfaces", AIP Journal of Applied Physics, vol. 102, (2007), pp. 1-7.
Non-Final Office Action issued in U.S. Appl. No. 15/446,295, dated Nov. 3, 2017.
Notice of Allowance issued in U.S. Appl. No. 15/446,295, dated Apr. 26, 2018.
Non-Final Office Action issued in related U.S. Appl. No. 16/105,925, dated May 13, 2019.
Notice of Allowance issued in related U.S. Appl. No. 16/105,925, dated Sep. 13, 2019.
Non-Final Office Action issued in U.S. Appl. No. 16/725,553, dated Mar. 16, 2020.
Final Office Action issued in U.S. Appl. No. 16/725,553, dated Jul. 20, 2020.
Notice of Allowance issued in U.S. Appl. No. 16/725,553, dated Oct. 7, 2020.

(56) References Cited

OTHER PUBLICATIONS

K.D. Weeks et al., "Characterization and analysis of epitaxial silicon phosphorus alloys for use in n-channel transistors," Thin Solid Films, 520 (2012) 3158-3162.

* cited by examiner

ENHANCED CHANNEL STRAIN TO REDUCE CONTACT RESISTANCE IN NMOS FET DEVICES

CROSS-REFERENCE TO RELATED APPLICATIONS

This Application is a Continuation Application of U.S. application Ser. No. 16/725,553, filed Dec. 23, 2019, now U.S. Pat. No. 10,916,546, which is a Continuation Application of U.S. application Ser. No. 16/105,925, filed Aug. 20, 2018, now U.S. Pat. No. 10,515,966, which is a Continuation Application of U.S. patent application Ser. No. 15/446,295, filed Mar. 1, 2017, now U.S. Pat. No. 10,056,383, which is a Divisional Application of U.S. application Ser. No. 14/859,165, filed Sep. 18, 2015, now U.S. Pat. No. 9,607,838, the subject matter of each of which is incorporated herein by reference in their entireties.

TECHNICAL FIELD

The disclosure relates to a semiconductor integrated circuit, more particularly to a semiconductor device having fin field effect transistor (Fin FET) structures and its manufacturing process.

BACKGROUND

As the semiconductor industry has progressed into nanometer technology process nodes in pursuit of higher device density, higher performance, and lower costs, challenges from both fabrication and design issues have resulted in the development of three-dimensional designs, such as a Fin FET. Fin FET devices are a type of multi-gate structure that typically include semiconductor fins with high aspect ratios and in which channel and source/drain regions of semiconductor transistor devices are formed. A gate is formed over and along the sides of the fin structure (e.g., wrapping) utilizing the advantage of the increased surface area of the channel and source/drain regions to produce faster, more reliable and better-controlled semiconductor transistor devices. In some devices, strained materials in the source/drain regions of the Fin FET device utilize, for example, phosphorous doped silicon-containing epitaxial layering.

BRIEF DESCRIPTION OF THE DRAWINGS

Aspects of the present disclosure are best understood from the following detailed description when read with the accompanying figures. It is to be understood that the following disclosure provides many different embodiments, or examples, for implementing different features of the present disclosure. Specific examples of components and arrangements are described below to simplify the present disclosure. These are, of course, merely examples and are not intended to be limiting. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
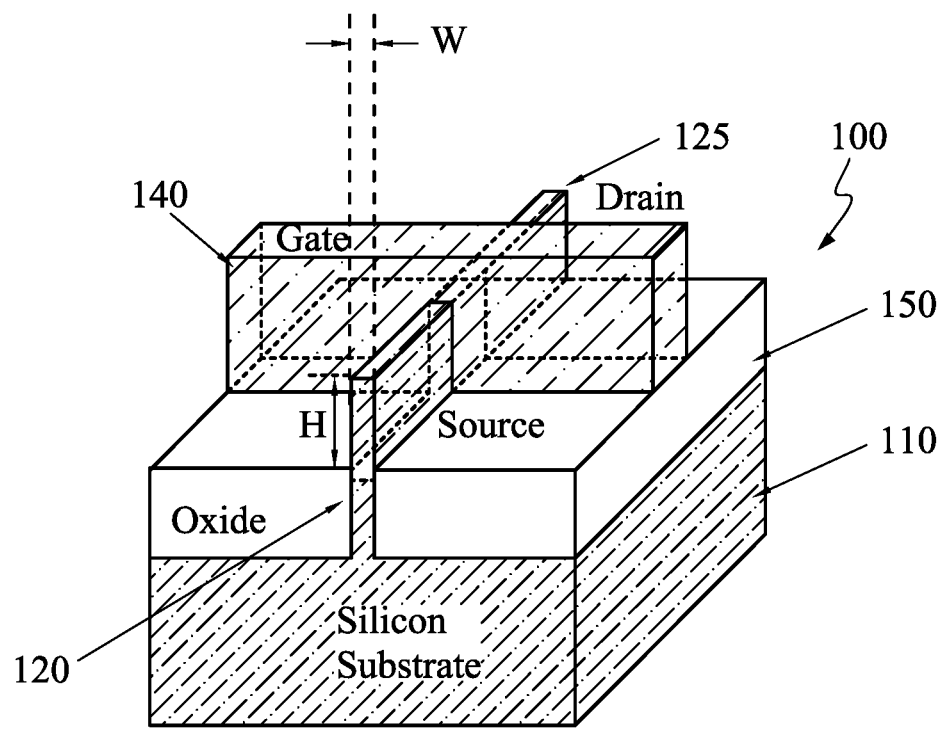
FIG. 1 is an exemplary perspective view of a Fin Field-Effect Transistor (Fin FET) device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

Figure 2:
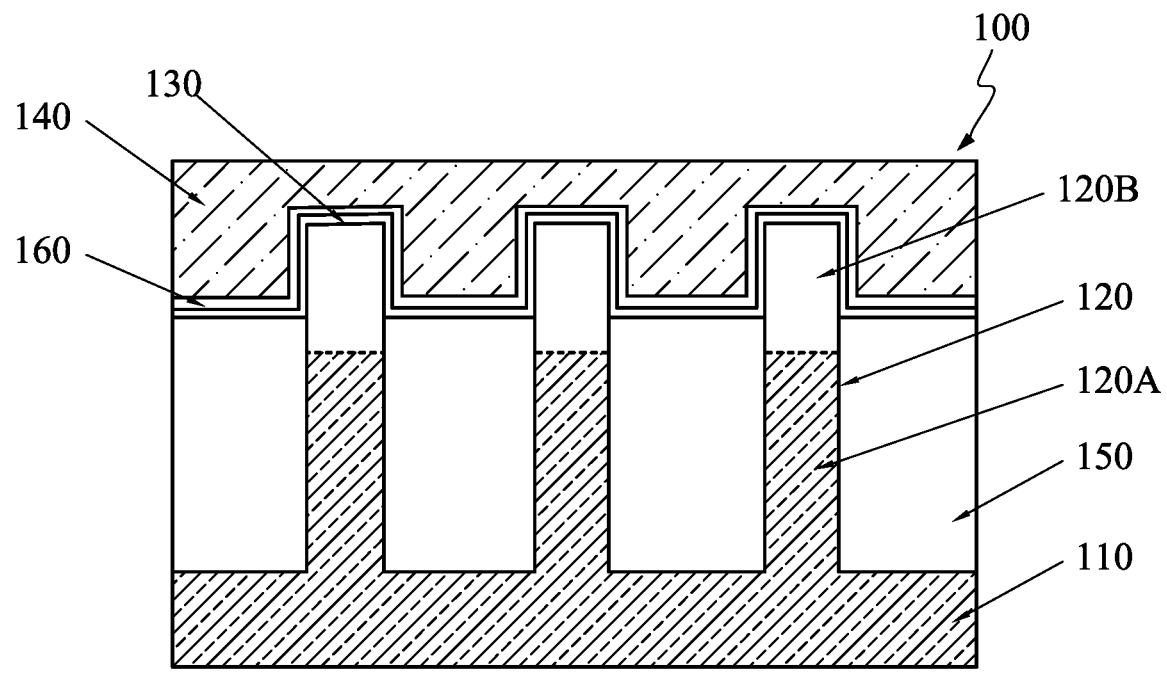
FIG. 2 is an exemplary cross sectional view of the Fin FET device having fin structures along a gate electrode in accordance with some embodiments of the present disclosure.

FIG. 1 is an exemplary perspective view of a Fin Field-Effect Transistor (Fin FET) device 100 having a fin structure according to one embodiment of the present disclosure, and FIG. 2 is an exemplary cross sectional view of the Fin FET device 100 having a fin structure along a gate electrode according to one embodiment of the present disclosure. In these figures, some layers/features are omitted for simplification.

The Fin FET device 100 depicted in FIGS. 1 and 2 includes, among other features, a substrate 110, a fin structure 120, a gate dielectric layer 130 and a gate electrode 140. In this embodiment, the substrate 110 is a silicon substrate. Alternatively, the substrate 110 may comprise another elementary semiconductor, such as germanium; a compound semiconductor including IV-IV compound semiconductors such as SiC and SiGe, III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 110 is a silicon layer of an SOI (silicon-on insulator) substrate. When an SOI substrate is used, the fin structure 120 may protrude from the silicon layer of the SOI substrate or may protrude from the insulator layer of the SOI substrate. In the latter case, the silicon layer of the SOI substrate is used to form the fin structure 120. Amorphous substrates, such as amorphous Si or amorphous SiC, or insulating material, such as silicon oxide may also be used as the substrate 110. The substrate 110 may include various regions that have been suitably doped with impurities (e.g., p-type or n-type conductivity).

The fin structure 120 is disposed over the substrate 110. The fin structure 120 may be made of the same material as the substrate 110 and may continuously extend from the substrate 110. In this embodiment, the fin structure 120 is made of silicon (Si). The silicon layer of the fin structure 120 may be intrinsic, or appropriately doped with an n-type impurity or a p-type impurity.

In FIG. 1, one fin structure 120 is disposed over the substrate 110, while in FIG. 2, three fin structures 120 are disposed over the substrate 110. However, the number of the fin structures is not limited to one or three. The numbers may be two or four or more. In addition, one or more dummy fin structures may be disposed in contact with both sides of the fin structures 120 to improve pattern fidelity in patterning processes. The width W of the fin structure 120 is in a range from about 5 nm to about 40 nm in some embodiments, and is in a range from about 7 nm to about 12 nm in certain embodiments. The height H of the fin structure 120 is in a range from about 100 nm to about 100 nm in some embodiments, and is in a range from about 50 nm to about 100 nm in other embodiments.

In FIG. 2, spaces between the fin structures 120 and/or a space between one fin structure and another element formed over the substrate 110 are filled by an isolation insulating layer (e.g., isolation region 150) including one or more layers of insulating materials. The insulating materials for the isolation region 150 may include one or more layers of silicon oxide, silicon nitride, silicon oxynitride (SiON), SiOCN, fluoride-doped silicate glass (FSG), or a low-K dielectric material.

The lower part of the fin structure 120 under the gate electrode 140 is referred to as a well region 120A, and the upper part of the fin structure 120 is referred to as a channel region 120B, as shown in FIG. 2. Under the gate electrode 140, the well region 120A is embedded in the isolation region 150, and the channel region 120B protrudes from the isolation region 150. A lower part of the channel region 120B may also be embedded in the isolation region 150 to a depth of about 1 nm to about 5 nm.

The channel region 120B protruding from the isolation region 150 is covered by a gate dielectric layer 130, and the gate dielectric layer 130 is further covered by a gate electrode 140. Part of the channel region 120B not covered by the gate electrode 140 functions as a source and/or drain of the Fin FET device 100 (see, FIG. 1).

In certain embodiments, the gate dielectric layer 130 includes a single layer or alternatively a multi-layer structure, having one or more dielectric materials, such as a single layer of silicon oxide, silicon nitride, or high-k dielectric material, other suitable dielectric material, and/or combinations thereof, or a multilayer of two or more of these materials. Examples of high-k dielectric material include $HfO_2$, HfSiO, HfSiON, HfTaO, HfSiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof.

The gate electrode 140 includes one or more layers of any suitable material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate structure may be formed using a gate-last or replacement gate methodology.

In certain embodiments of the present disclosure, one or more work function adjustment layers 160 is interposed between the gate dielectric layer 130 and the gate electrode 140. The work function adjustment layer 160 may include a single layer or alternatively a multi-layer structure, such as various combinations of a metal layer with a selected work function to enhance the device performance (work function metal layer), liner layer, wetting layer, adhesion layer, metal alloy or metal silicide. The work function adjustment layers 160 are made of one or more conductive materials such as a single layer of Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials, or a multilayer of two or more of these materials. In some embodiments, the work function adjustment layer 160 may include a first metal material for the n-channel Fin FET and a second metal material for the p-channel Fin FET. For example, the first metal material for the n-channel Fin FET may include metals having a work function substantially aligned with a work function of the substrate conduction band, or at least substantially aligned with a work function of the conduction band of the channel region 120B. Similarly, for example, the second metal material for the p-channel Fin FET may include metals having a work function substantially aligned with a work function of the substrate valence band, or at least substantially aligned with a work function of the valence band of the channel region 120B. In some embodiments, the work function adjustment layer 160 may alternatively include a polysilicon layer. The work function adjustment layer 160 may be formed by ALD, PVD, CVD, e-beam evaporation, or other suitable process. Further, the work function adjustment layer 160 may be formed separately for the n-channel Fin FET and the p-channel Fin FET which may use different metal layers.

Source and drain regions 125 are also formed in the upper part of the fin structure 120 not covered by the gate electrode 140, by appropriately doping impurities in the source and drain regions 125. An alloy of Si or Ge and a metal such as Co, Ni, W, Ti or Ta may be formed on the source and drain regions 125. In some aspects, strained materials in the source and drain regions 125 utilize, for example, phosphorous doped silicon-containing epitaxial layering.

An ion implantation is generally implemented for forming the source and drain regions 125. For example, an N-type source/drain process includes a room-temperature phosphorus ion implantation that is provided to form the phosphorus doped silicon-containing epitaxial layering. In NMOS Fin FET structures (e.g., n-type source/drain regions), channel mobility is adversely impacted by parasitic capacitance that is formed after the ion implantation. In one approach to reduce the parasitic capacitance, the phosphorus ion implantation is performed with a relatively high concentration of single-atom phosphorus (e.g., above $1 \times 10^{21}$ atoms/cm$^3$). Although the higher concentration can yield higher doping, since some phosphorus atoms can cluster locally (e.g., form $Si_3P_4$ compound) and act as stressors, the ion implantation induces lower dopant activation. To overcome the lower activation, another approach includes a high temperature anneal to activate the dopants and possibly cure damage resulting from the ion implantation. However, the increase in temperature for the thermal anneal causes an undesirable strain loss in the channel region 120B.

The present disclosure provides for the reduction of contact capacitance and increase in channel mobility for NMOS Fin FET structures by providing relatively heavy and shallow doping on a top surface of the phosphorus doped silicon-containing epitaxial layer. In particular, a phosphorus dimer ($P_2^+$) ion implantation is utilized after the epitaxial growth operation in order to effectively incorporate a higher chemical phosphorus concentration and to cause a higher amorphous level than the conventional phosphorus ion implantation under a same implantation energy. The phosphorus dimer ion implantation may be, or may be a part of, a cryo-implantation with temperatures below about −20° C. to induce a higher amorphous level (or lower activation energy).

FIGS. 3-19 illustrate examples of cross-sectional views of intermediate stages in the sequential fabrication of a Fin FET device 300 in accordance with some embodiments of the present disclosure. Not all of the depicted components may be required, however, and one or more implementations may include additional components not shown in the figure. Variations in the arrangement and type of the components may be made without departing from the scope of the claims as set forth herein. Additional processes, operations, material, components, different components, or fewer components may be provided. Further, the order of the operations may be changed.

Figure 3:
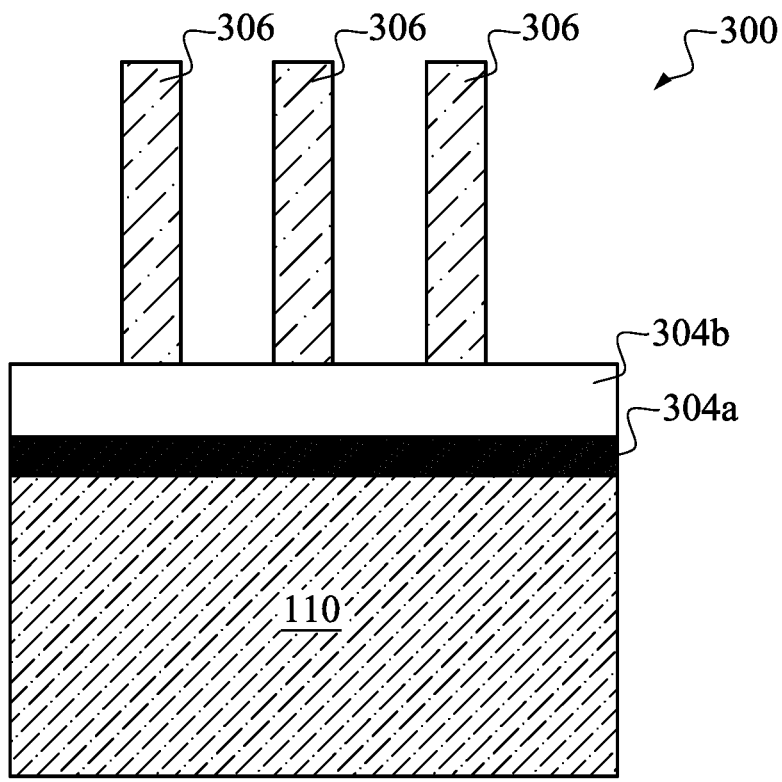
FIGS. 3-19 illustrate examples of cross-sectional views of intermediate stages in the sequential fabrication process of a Fin FET structure in accordance with some embodiments of the present disclosure.

FIG. 3 is a cross-sectional view of the Fin FET device 300 having a substrate 110 at one of various stages of the sequential fabrication process according to an embodiment of the present disclosure. In this embodiment, the substrate 110 includes a crystalline silicon substrate (e.g., wafer). A p-type substrate or n-type substrate may be used and the substrate 110 may include various doped regions, depending on design requirements. In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type Fin FET, or alternatively configured for a p-type Fin FET.

In some alternative embodiments, the substrate 110 is made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Also alternatively, the substrate may include an epitaxial layer. For example, the substrate may have an epitaxial layer overlying a bulk semiconductor. Further, the substrate may be strained for performance enhancement. For example, the epitaxial layer may include a semiconductor material different from that of the bulk semiconductor, such as a layer of silicon germanium overlying bulk silicon or a layer of silicon overlying bulk silicon germanium. Such strained substrates may be formed by selective epitaxial growth (SEG). Furthermore, the substrate may include a SOI structure. Also alternatively, the substrate may include a buried dielectric layer, such as a buried oxide (BOX) layer, such as that formed by separation by implantation of oxygen (SIMOX) technology, wafer bonding, SEG, or other appropriate operation.

In one embodiment, a pad layer 304a and a mask layer 304b are formed on the semiconductor substrate 110. The pad layer 304a may be a thin film having silicon oxide formed, for example, using a thermal oxidation operation. The pad layer 304a may act as an adhesion layer between the semiconductor substrate 110 and the mask layer 304b. The pad layer 304a may also act as an etch stop layer for etching the mask layer 304b. In at least one embodiment, the mask layer 304b is formed of silicon nitride, for example, using low-pressure chemical vapor deposition (LPCVD) or plasma enhanced chemical vapor deposition (PECVD). The mask layer 304b is used as a hard mask during subsequent patterning operations. A photoresist layer 306 is formed on the mask layer 304b and is then patterned by a photolithography patterning operation, forming openings in the photoresist layer 306. The photoresist layer may be removed after patterning of the mask layer 304b and pad layer 304a and before the trench etching.

The photolithography patterning operation may include photoresist coating (e.g., spin-on coating), soft baking, mask aligning, exposing, post-exposure baking, developing a photoresist, rinsing, drying (e.g., hard baking), other suitable operations, or combinations thereof. Alternatively, the photolithography patterning operation is implemented or replaced by other proper methods such as maskless photolithography, electron-beam writing, direct-writing, and/or ion-beam writing. The photolithography patterning operation yields the photoresist layer that is used as a mask during a trench etching operation.

Figure 4:
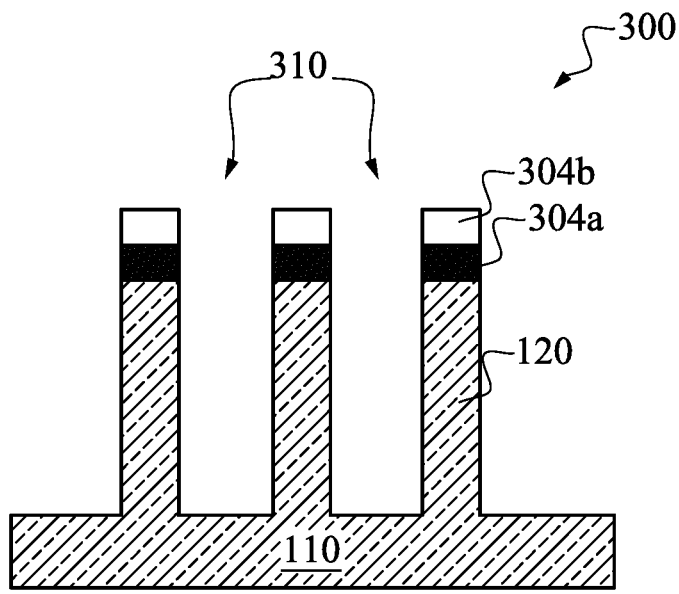

FIG. 4 is a cross-sectional view of the Fin FET device 300 at one of various stages of the sequential fabrication process according to an embodiment of the present disclosure. The mask layer 304b and pad layer 304a are etched to expose underlying semiconductor substrate 110. The exposed semiconductor substrate 110 is then trench-etched to form trenches 310 by using the patterned mask layer 304b and pad layer 304a as a mask.

In the trench etching operation, the substrate 110 may be etched by various methods, including a dry etch, a wet etch, or a combination of dry etch and wet etch. The dry etching operation may implement fluorine-containing gas (e.g., $CF_4$, $SF_6$, $CH_2F_2$, $CHF_3$, and/or $C_4F_8$), chlorine-containing gas (e.g., $Cl_2$, $CHCl_3$, $CCl_4$, and/or $BCl_3$), bromine-containing gas (e.g., $HBr$ and/or $CHBr_3$), oxygen-containing gas, iodine-containing gas, other suitable gases and/or plasmas, or combinations thereof.

Next, a wet cleaning operation may be performed to remove a native oxide of the semiconductor substrate 110. The cleaning may be performed using dilute hydrofluoric (DHF) acid. Portions of the semiconductor substrate 110 between trenches 310 form semiconductor fins 120. The fins 120 may be arranged in columns (viewed from on top of the Fin FET device 300) parallel to each other, and closely spaced with respect to each other. Each of the fins 120 has a width W and a depth D, and are spaced apart from an adjacent fin by a width S of the trench 310. For example, the width W of the semiconductor fin 120 may be in a range from about 3 nm to about 30 nm in some embodiments.

Figure 5:
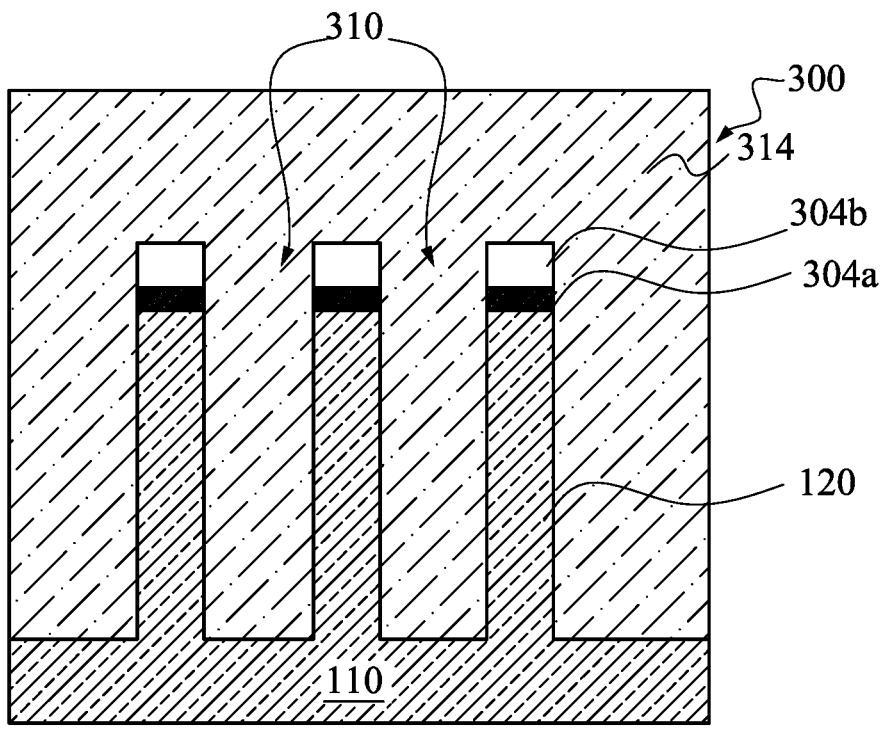

FIG. 5 is a cross-sectional view of the Fin FET device 300 at one of various stages of the sequential fabrication process according to an embodiment of the present disclosure. Trenches 310 are filled with one or more layers of a dielectric material 314. The dielectric material 314 may include silicon oxide. In one or more implementations, the dielectric material 314 is made of, for example, silicon dioxide formed by LPCVD (low pressure chemical vapor deposition), plasma-CVD or flowable CVD. In the flowable CVD, flowable dielectric materials instead of silicon oxide are deposited. Flowable dielectric materials, as their name suggests, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove undesired element(s) to form silicon oxide. When the undesired element(s) is removed, the flowable film densifies and shrinks. In some embodiments, multiple anneal operations are conducted. The flowable film is then cured and annealed.

In some embodiments, other dielectric materials, such as silicon nitride, silicon oxynitride, fluoride-doped silicate glass (FSG), or a low-K dielectric material, may also be used to form the dielectric material 314. In an embodiment, the dielectric material 314 is formed using a high-density-plasma (HDP) CVD operation, using silane ($SiH_4$) and oxygen ($O_2$) as reacting precursors. In other embodiments, the dielectric material 314 may be formed using a sub-atmospheric CVD (SACVD) operation or high aspect-ratio process (HARP), in which process gases may include tetraethylorthosilicate (TEOS) and/or ozone (O3). In yet other embodiments, the dielectric material 314 may be formed using a spin-on-dielectric (SOD) operation, such as hydrogen silsesquioxane (HSQ) or methyl silsesquioxane (MSQ). In some embodiments, the filled recess region (or the trenches 310) may have a multi-layer structure such as a thermal oxide liner layer filled with silicon nitride or silicon oxide.

Figure 6:
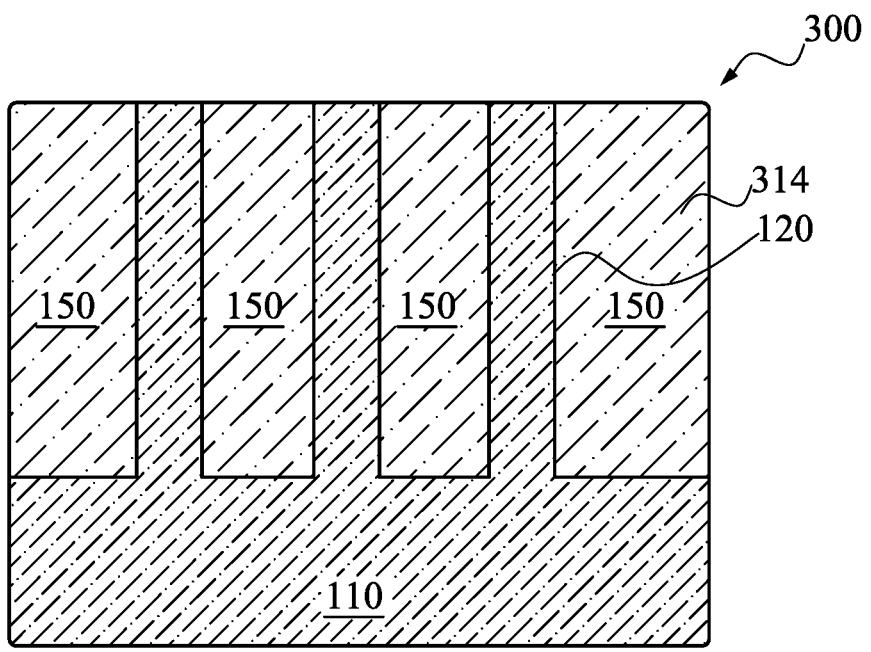

FIG. 6 is a cross-sectional view of the Fin FET device 300 at one of various stages of the sequential fabrication process according to an embodiment of the present disclosure. After the deposition of the dielectric material 314, a chemical mechanical polish (CMP) and/or an etch-back operation are then performed, followed by the removal of the mask layer 304b and pad layer 304a. An annealing operation may be performed after the trenches 310 are filled with the dielectric material 314. The annealing operation includes rapid thermal annealing (RTA), laser annealing operations, or other suitable annealing operations.

In at least one embodiment, the mask layer 304b is formed of silicon nitride such that the mask layer 304b is removed using a wet etching operation using $H_3PO_4$. The pad layer 304a may be removed using dilute HF acid, if the pad layer 304a is formed of silicon oxide. The remaining portions of the dielectric material 314 in the trenches 310 are hereinafter referred to as isolation regions 150. In some embodiments, the removal of the mask layer 304b and the pad layer 304a is performed after the recessing of the isolation regions 150, which recessing operation is shown in FIG. 7.

Figure 7:
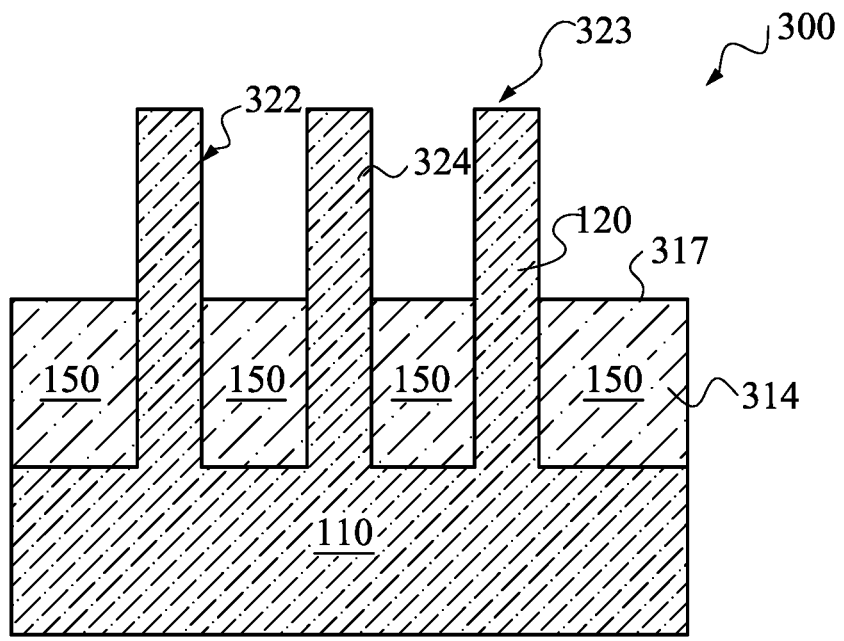

FIG. 7 is a cross-sectional view of the Fin FET device 300 at one of various stages of the sequential fabrication process according to an embodiment of the present disclosure. An etching operation may be performed to etch isolation regions 150 to expose upper portions 322 of the semiconductor fins 120 from the isolation regions 150. The etching operation may include a dry etching operation, wet etching operation, or combination dry and wet etching operations to remove portions of the isolation regions 150. It is understood that the etching operation may be performed as one etching operation or multiple etching operations.

The remaining isolation regions 150 include top surfaces 317. Further, the upper portions 322 of the semiconductor fins 120 protruding over the top surfaces 317 of the remaining isolation regions 150 thus are used to form an active area, such as a channel region, of the Fin FET device 300. The upper portions 322 of the semiconductor fins 120 may include top surfaces 323 and sidewalls 324. Height H of the upper portions 322 of the semiconductor fins 120 from the top surface 317 of the isolation regions 150 may be in a range from about 6 nm to about 300 nm. In some embodiments, the height H is greater than 300 nm or smaller than 6 nm. For simplicity, the upper portion 322 of the semiconductor fin 120 between adjacent isolation regions 150 is hereinafter referred to as the channel region to illustrate each upper portion of the semiconductor fin 120, in which the top surfaces 317 of the isolation regions 150 are lower than the top surface 323 of the semiconductor fin 120.

Figure 8:
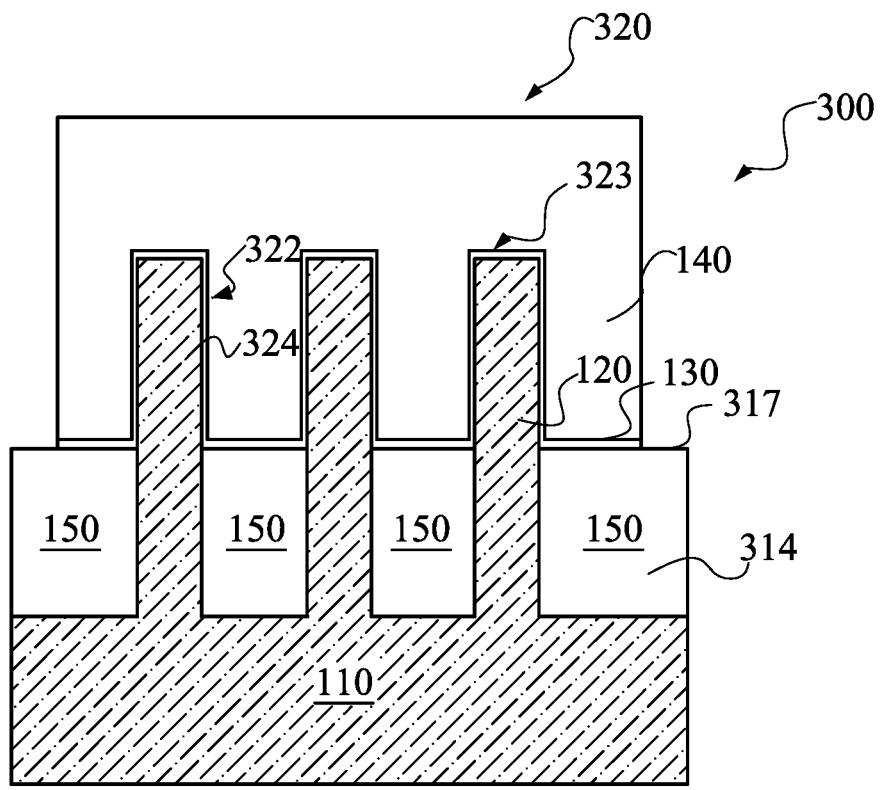

FIG. 8 is a perspective view of the n-type Fin FET device 802 and the p-type Fin FET device 804 at one of various stages of the sequential fabrication process according to an embodiment of the subject technology. A gate stack 320 is formed over the top surface 323 and sidewalls 324 of the semiconductor fin 120, extending to the top surfaces 317 of the first isolation region 150a and the second isolation region 150b. The gate stack 320 includes a gate dielectric layer 130 and a gate electrode layer 140 over the gate dielectric layer 130.

The gate dielectric layer 130 is formed to cover the top surface 323 and sidewalls 324 of at least a portion of the channel region of the semiconductor fins 120. In some embodiments, the gate dielectric layer 130 includes one or more layers of silicon oxide, silicon nitride, silicon oxynitride, or high-k dielectrics. High-k dielectrics may include metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. The gate dielectric layer 130 may be formed using a suitable operation such as atomic layer deposition (ALD), chemical vapor deposition (CVD), physical vapor deposition (PVD), thermal oxidation, UV-ozone oxidation, or combinations thereof. The gate dielectric layer 130 may further include an interfacial layer (not shown) to reduce damage between the gate dielectric layer 130 and the fin 120. The interfacial layer may include silicon oxide.

The gate electrode layer 140 is then formed on the gate dielectric layer 130. In at least one embodiment, the gate electrode layer 140 covers the upper portion 322 of more than one semiconductor fin 120, so that the resulting n-type Fin FET device 802 includes more than one fin structure. In some alternative embodiments, each of the upper portions 322 of the semiconductor fins 120 may be used to form a separate n-type Fin FET device 802. The gate electrode layer 140 may include a single layer or a multilayer structure. The gate electrode layer 140 may include poly-silicon. Further, the gate electrode layer 140 may be doped poly-silicon with the uniform or non-uniform doping. In some alternative embodiments, the gate electrode layer 140 may include a metal such as Al, Cu, W, Ti, Ta, TiN, TiAl, TiAlN, TaN, NiSi, CoSi, other conductive materials with a work function compatible with the substrate material, or combinations thereof. The gate electrode layer 140 may be formed using a suitable operation such as ALD, CVD, PVD, plating, or combinations thereof. In some embodiments, a hard mask layer 332, which has been used to pattern a poly silicon layer, is formed on the gate stack 320.

In FIGS. 9-19, a semiconductor device having one or more p-type Fin FET structures (e.g., p-type Fin FET device 904) and one or more n-type Fin FET structures (e.g., n-type Fin FET device 902) is illustrated. In the present disclosure, the Fin FET device 300 is depicted as one of the n-type Fin FET structures but can be configured as another type of Fin FET structure depending on implementation. For purposes of simplification, the subject matter in FIGS. 9-19 will be discussed in reference to the n-type Fin FET device 902 with additional reference made to the p-type Fin FET device 904 for certain features of the sequential fabrication.

Figure 9:
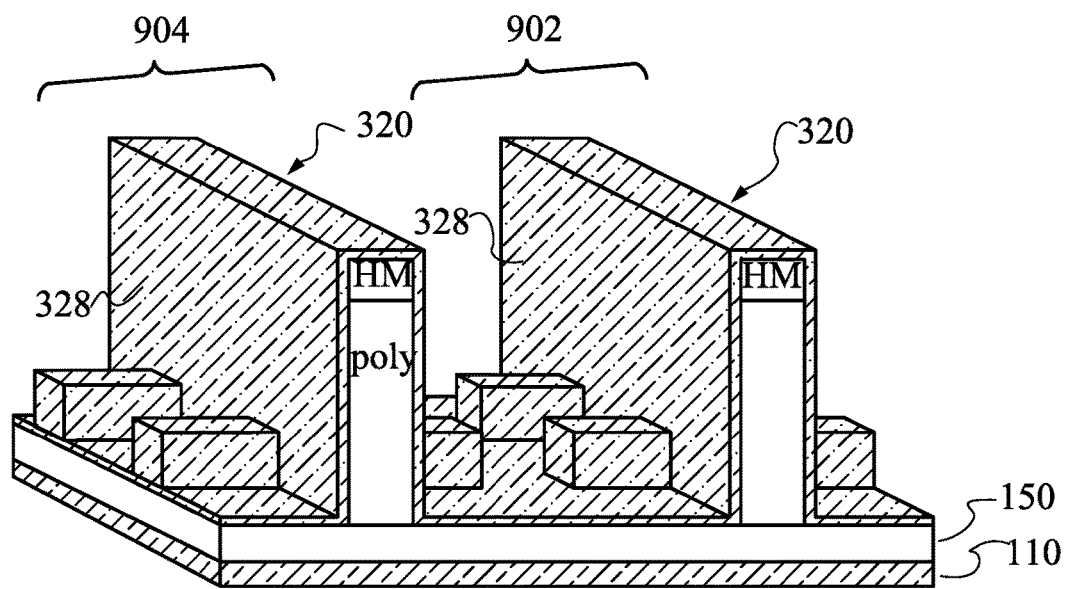

FIG. 9 is a perspective view of the n-type Fin FET device 902 and the p-type Fin FET device 904 at one of various stages of the sequential fabrication process according to an embodiment of the subject technology. In FIG. 9, one gate structure is provided for two fin structures. In FIG. 9, the n-type Fin FET device 902 is covered by sidewall spacer material 328 made of a dielectric layer along the vertical side of the gate stack 320. In some embodiments, the dielectric layer includes one or more layers of silicon oxide, silicon nitride, silicon oxy-nitride, or other suitable material. The dielectric layer may include a single layer or multilayer structure. A blanket layer of the dielectric layer may be formed by CVD, PVD, ALD, or other suitable technique. Then, an anisotropic etching and/or etch-back operation is performed on the dielectric layer to form a pair of sidewall spacer material 328 on two sides of the gate stack 320. During the formation of the gate stack 320, various cleaning/etching operations, which etch the STI regions 150 and 150b, are performed.

Figure 10:
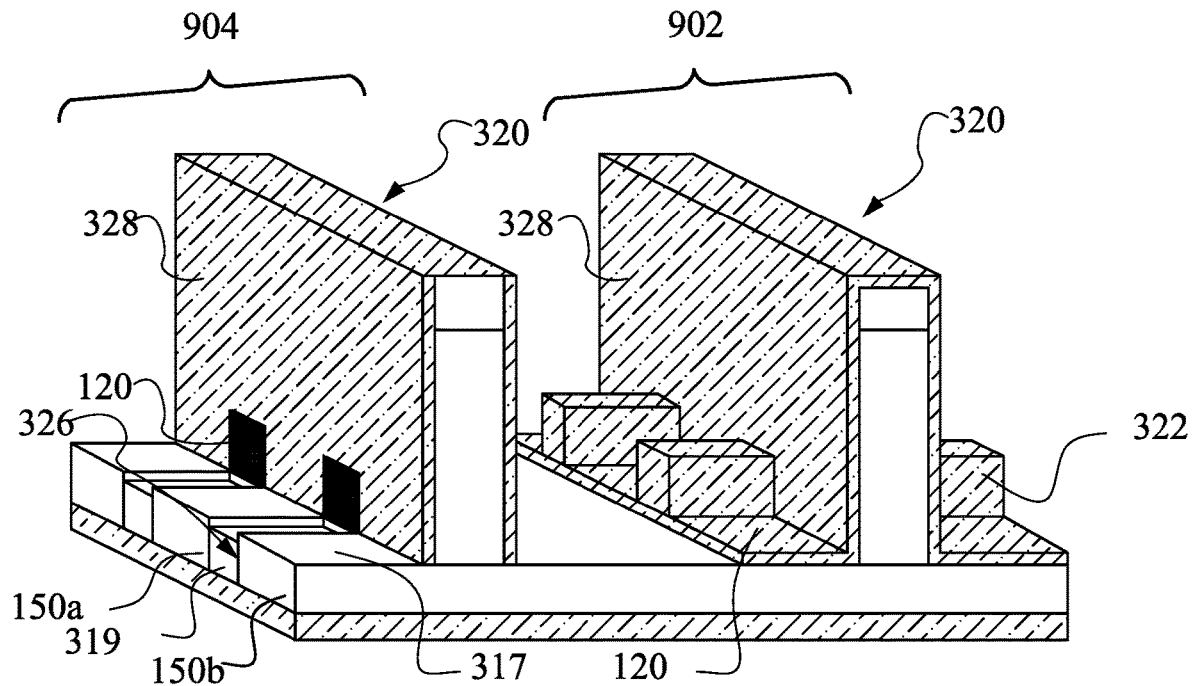

FIG. 10 is a perspective view of the n-type Fin FET device 902 and the p-type Fin FET device 904 at one of various stages of the sequential fabrication process according to an embodiment of the subject technology. The portion of the semiconductor fin 120 not covered by the gate stack 320 (FIG. 8) and sidewall spacer material 328 (FIG. 9) formed thereover are recessed to form a recessed portion 326 of the semiconductor fin 120 having a top surface 319 below the top surfaces 317 of the first and second isolation regions 150a, 150b. In one embodiment, using the sidewall spacer material 328 as hard masks, a biased etching operation is performed to recess top surface 319 of the upper portion 322 that are unprotected or exposed to form the recessed portion 326 of the semiconductor fin 120. In an embodiment, the etching operation may be performed using HBr and/or $Cl_2$ as etch gases.

Figure 11:
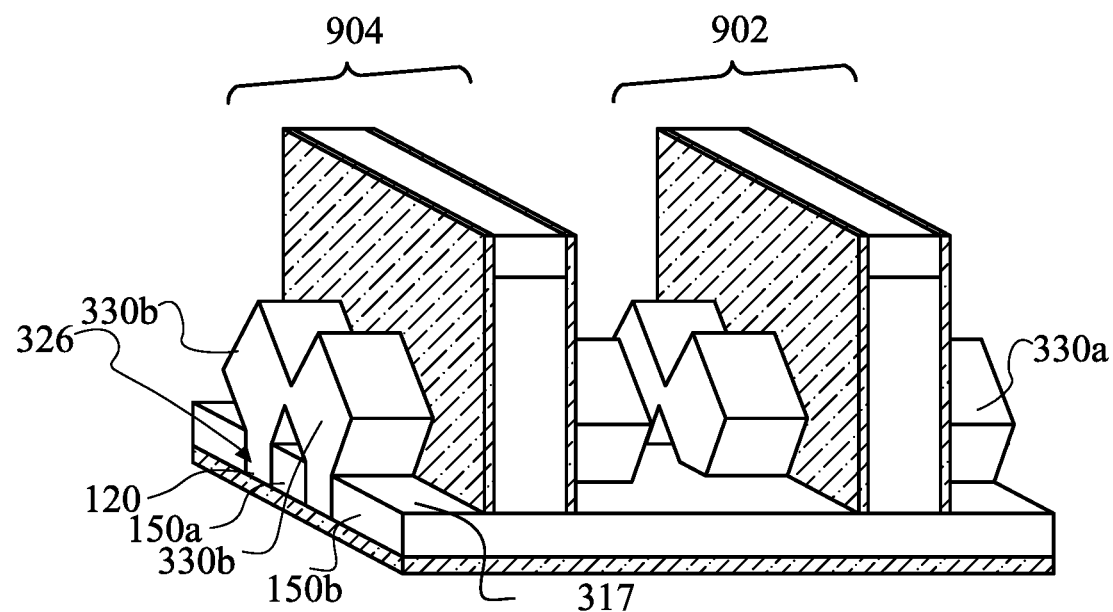

FIG. 11 is a perspective view of the n-type Fin FET device 902 and the p-type Fin FET device 904 at one of various stages of the sequential fabrication process according to an embodiment of the present disclosure. The structures depicted in FIG. 11 are produced by selectively growing a strained material (e.g., strained material 330a, 330b) over the recessed portion 326 of the semiconductor fin 120 and extending over the top surfaces 317 of the first and second isolation regions 150a, 150b. Since the lattice constant of the strained material 330a, 330b is different from the channel region of the semiconductor fin 120, the channel region of the semiconductor fin 120 is strained or stressed to enable carrier mobility of the device and enhance the device performance. Although the strained material 330a, 330b is formed separately with respect to each fin in FIG. 11, the strained material 330a, 330b may be connected to form a common strain material structure.

In at least one embodiment, strained material 330a, such as silicon carbon (SiC) and/or silicon phosphide (SiP), is epitaxially grown by a LPCVD operation to form the source and drain regions of the n-type Fin FET device 902. In at least another embodiment, strained material 330b, such as silicon germanium (SiGe), is epitaxially grown by a LPCVD operation to form the source and drain regions of the p-type Fin FET device 904.

The p-type Fin FET device 904 and the n-type Fin FET device 902 are separately formed. In this regard, an n-type epitaxial region or p-type epitaxial region can be defined using photolithography and etching operations. In FIGS. 10 and 11, the n-type Fin FET 902 is covered by, for example, a silicon nitride (SiN) layer such that the n-type Fin FET 902 is protected during the recess and source/drain formation in the p-type Fin FET 904. After the strained material 330b is formed for the p-type Fin FET 904, the p-type Fin FET is covered by a SiN layer, and then similar operations including recess formation and strain material formation are performed on the n-type Fin FET 902.

Figure 12A:
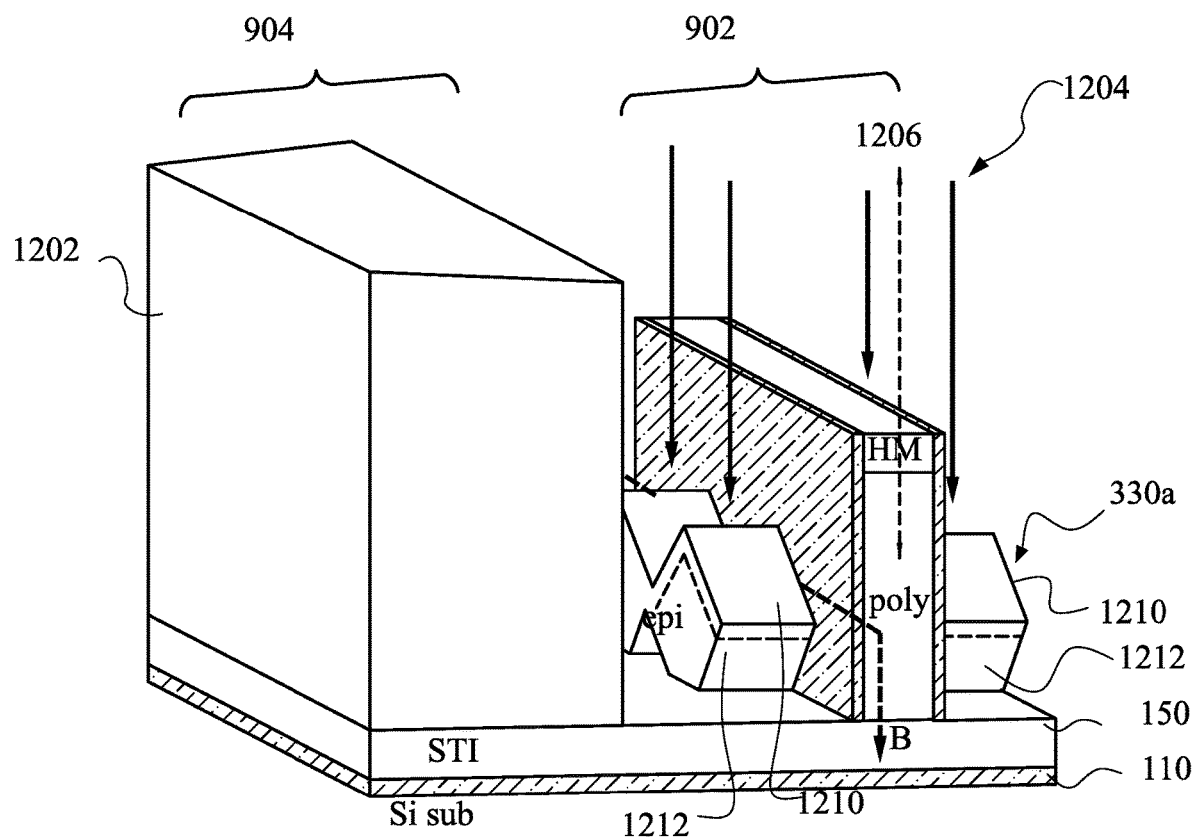
Figure 12B:
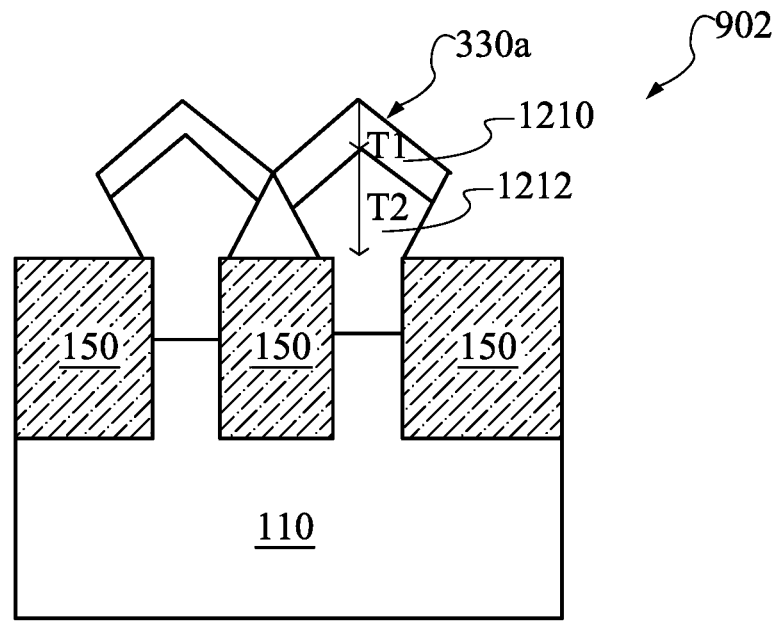
Figure 12C:
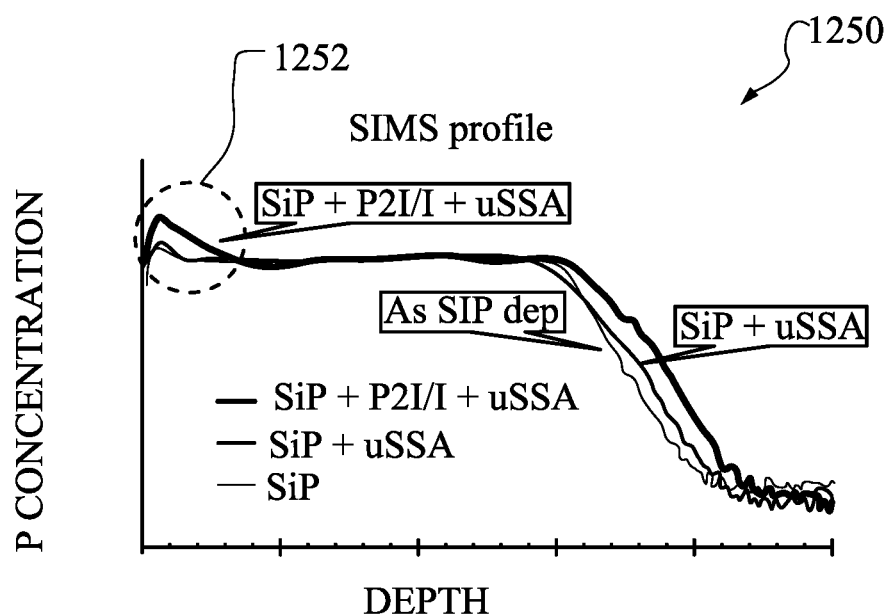

FIG. 12A is a perspective view of the n-type Fin FET device 902 and the p-type Fin FET device 904 at one of various stages of the sequential fabrication process according to an embodiment of the present disclosure. FIG. 12B illustrates a cross-sectional view of the n-type Fin FET device 902 along B-B' according to an embodiment of the present disclosure. FIG. 12C illustrates a plot of an example of doping concentrations over a range of depths according to an embodiment of the present disclosure.

While the p-type Fin FET device 904 is covered by a photoresist layer 1202, a phosphorus dimer ion implantation 1204 is performed as shown in FIG. 12A. As discussed above, the present disclosure provides for the reduction of contact capacitance and increase in channel mobility for the n-type Fin FET device 902 by providing relatively heavy and shallow doping on a top surface of a phosphorus doped epitaxial layer (e.g., the n-type epitaxial region of the n-type Fin FET device 902). In particular, the phosphorus dimer ($P_2^+$) ion implantation 1204 is utilized to effectively introduce a higher chemical phosphorus concentration and to increase a higher amorphous level than the conventional phosphorus ion implantation using $P^+$.

The implantation of phosphorus dimer ions is performed on the top surface of the strained material 330a to provide a high phosphorus concentration to reduce contact resistance with a contact from an upper layer and to increase the tensile strain along the channel region thereby increasing the effective electron mobility of the n-type channel. In this regard, the higher tensile strain can cause a decrease in the bulk lattice parameter in the channel region, such as from about 0.543 nm to about 0.537 nm based on a 10% to 15% increase in phosphorus concentration at the top surface of the strain material 330a.

In some aspects, the phosphorus dimer ion implantation 1204 implants the dopant species using implant energy in a range from about 0.1 KeV to about 500 KeV. In some embodiments, the implant dosage is in a range from about $1 \times 10^{15}$ atoms/cm$^3$ to about $4 \times 10^{15}$ atoms/cm$^3$. In other embodiments, the acceleration voltage is in a range from about 10 KeV to about 100 KeV. In certain embodiments, the acceleration voltage is in a range from about 1 KeV to about 10 KeV. The tilt angle of the ion beam relative to a vertical axis 1206 may vary in a range from about 0 degrees to about 45 degrees. In addition, the ions can be implanted from two directions (e.g., 0 degrees and 180 degrees by rotating the wafer) or four directions.

In some embodiments, the phosphorus dimer ion implantation 1204 of the first doping agent includes cooling at least the first fin structure and the first strain material to a temperature below about −20° C.; hence, a cryo-implantation. The temperature in the cryo-implantation can be in a range from about −10° C. to about −100° C. For example, the n-type Fin FET device 902 including the n-type epitaxial region (or n-type strain material) can be cooled from a room temperature to a temperature of −20° C. in some embodiments, or below −20° C. in other embodiments.

The phosphorus dimer ion implantation 1204 at these cold temperatures induces more activated phosphorus dopants on the surface due to the relatively high amorphous degree (or lower activation energy needed for activation). As a result, the phosphorus dimer ion implantation 1204 performed as a cryo-implantation can cause more lateral straggle to occur compared to room-temperature implantation. This is because the colder temperatures cause the implanted phosphorus atoms to move further laterally relative to the point of initial penetration of the top surface of the strain material 330a. As used herein, the term "lateral variance" refers to the lateral movement of ions along an axis about orthogonal to the surface of initial penetration.

In one or more implementations, implanted ions (impurities) in the first region 1210 have a first lateral variance and impurities in the second region 1212 have a second lateral variance where the first lateral variance is greater than the second lateral variance due to the phosphorus dimer ion implantation 1204 performed as the cryo-implantation operation. As such, the increase in lateral variance causes a reduction in contact resistance of due to the relatively short channel length of the n-type Fin FET device 902. Following the phosphorus dimer ion implantation, the photoresist layer 1202, for example, may be removed. In addition, a thermal anneal operation is then performed (see FIG. 13). In some embodiments, cluster ions of phosphorus are used instead of phosphorus dimer ions.

As shown below in Table 1, two different examples of phosphorus dimer implantation and anneal are described. For example, devices A is implanted with phosphorus dimer dopants at room temperature; whereas device B is implanted with phosphorus dimer dopants at cryo temperatures (e.g., at about −20° C.). Both devices are implanted with the same dosage (between about $1 \times 10^{15}$ atoms/cm$^3$ and about $4 \times 10^{15}$ atoms/cm$^3$) and same anneal temperature (between about 950 and about 1250° C.). Compared to device A, device B exhibits a lower total resistance (0.98 relative to the resistance value of device A) and about 3% higher in gate-to-drain capacitance performance, and about 2% higher in gate-to-gate capacitance performance. The implantation at cryo temperatures yields a higher performing device with respect to total resistance and capacitance performance to provide for the increase in channel mobility for the NMOS Fin FET structure.

TABLE 1

S/D Phosphorus Dimer Implantation and Thermal Optimization

| | A | B |
|---|---|---|
| N + S/D Implantation Temperature | Room Temp | −20° C. |
| Relative Total Resistance | 1 | 0.98 |
| Relative Parasitic Resistance | 1 | 0.99 |
| Relative Channel Resistance | 1 | 0.99 |
| Relative Gate-Drain Capacitance | 1 | 1.03 |
| Relative Gate-to-Gate Capacitance | 1 | 1.02 |

As shown in FIG. 12B, the n-type epitaxial region may have a first region 1210 (including the top surface) having a first thickness ($T_1$) in a range from about 0.1 nanometers (nm) to about 8 nm. The first region 1210 may receive the higher concentration of phosphorus due to the phosphorus dimer ion implantation 1204 compared to a second region 1212 disposed below the first region 1210. In some embodiments, the second region 1212 has a second thickness ($T_2$) in a range from about 25 nm to about 60 nm, and contains a doping concentration based on the epitaxially grown silicon phosphide during the epitaxial growth operation or a single atom phosphorus implantation that may be optionally performed.

FIG. 12C illustrates a plot of an example of a SIMS (Secondary Ion Mass Spectroscopy) profile of doping concentrations over a range of depths. As shown in FIG. 12C, the peak phosphorus dimer doping density (labeled as "SiP+ P2 I/I+μSSA") in the present embodiment is greater than about $1 \times 10^{22}$ atoms/cm$^3$ (e.g., region 1252), and is located at less than a few nm from the top surface of the implanted silicon region (e.g., the first region 1210 of FIG. 12B) such that the doping concentration is increased near the surface. In contrast, the peak single-atom phosphorus doping density (labeled as "SiP dep") and the peak single-atom phosphorus doping density with micro-sub second anneal (labeled as "SiP+μSSA") are magnitudes smaller than the peak phosphorus dimer doping density. FIG. 12C shows that by using $P_2^+$ ion implantation, a higher amount of impurities can be introduced at a portion closer to the surface of the source/drain epitaxial regions.

Figure 13:
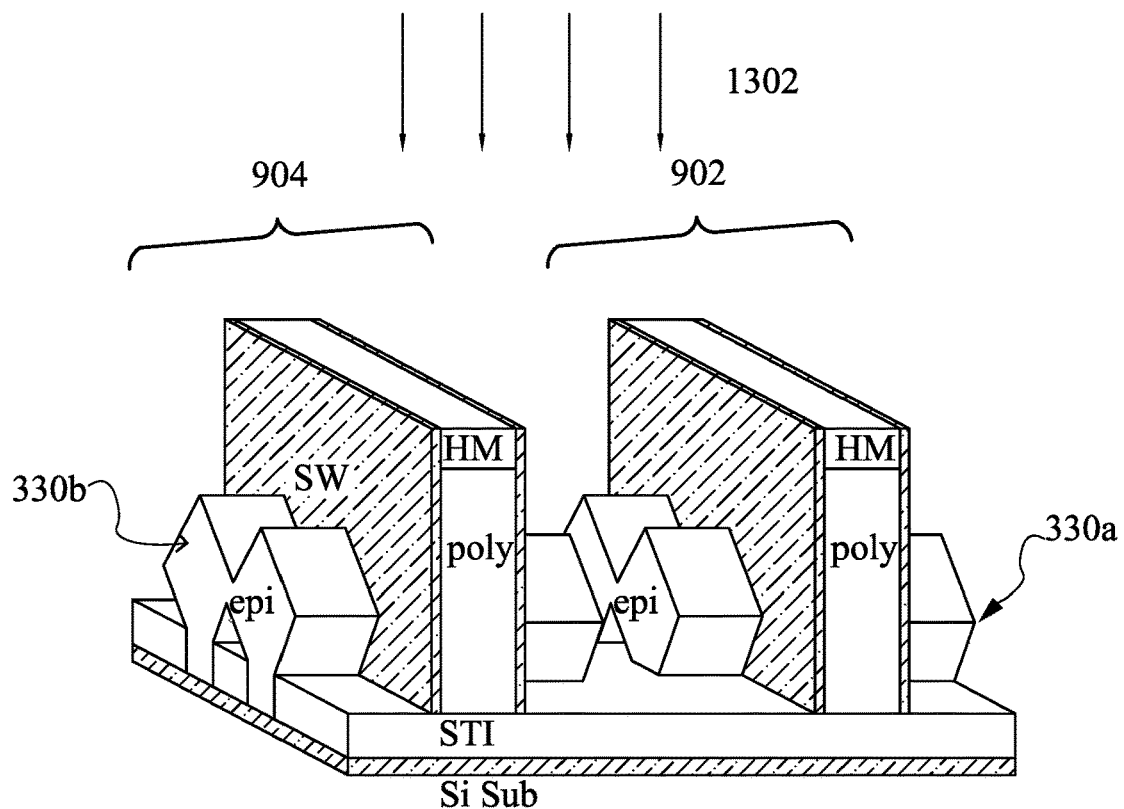

FIG. 13 is a perspective view of the n-type Fin FET device 902 and the p-type Fin FET device 904 at one of various stages of the sequential fabrication process according to an embodiment of the present disclosure. After the phosphorus dimer ion implantation 1204, a thermal anneal operation 1302 with temperatures in a range from about 950° C. to about 1250° C. may be performed to activate the implanted phosphorus. As discussed above, the increase in phosphorus concentration (via the phosphorus dimer ion implantation) increases the tensile strain applied on the channel region of the n-type Fin FET device 902. In this regard, the increase in tensile strain enhances channel electron mobility.

The application of the thermal anneal operation 1302 may include heating the semiconductor device, particularly the n-type Fin FET device 902, to a temperature in a range from 900° C. to 1000° C. in some embodiments, or to a temperature in a range from about 1000° C. to about 1300° C. in other embodiments. In some embodiments, the thermal anneal operation 1302 is applied for a duration in a range from about 1 second to about 10 seconds. In some aspects, the thermal anneal operation 1302 is applied uniformly across the n-type Fin FET device 902 and the p-type Fin FET device 904. The thermal anneal operation 1302 may include an anneal operation selected from a group including RTA, flash anneal, sub-second anneal (SSA), micro-sub second anneal (μSSA), laser anneal, etc. In some embodiments, RTA is performed at a temperature in a range from about 950° C. to about 1250° C. for about 7 to about 10 seconds, in some embodiments. Alternatively, the anneal operations are performed at a temperature in a range from about 1050 to about 1150° C. for about 1 to about 6 seconds, in other embodiments. In other embodiments, μSSA is performed at a temperature in a range from about 950 to about 1150° C. for about 10 to about 500 micro seconds.

Figure 14:
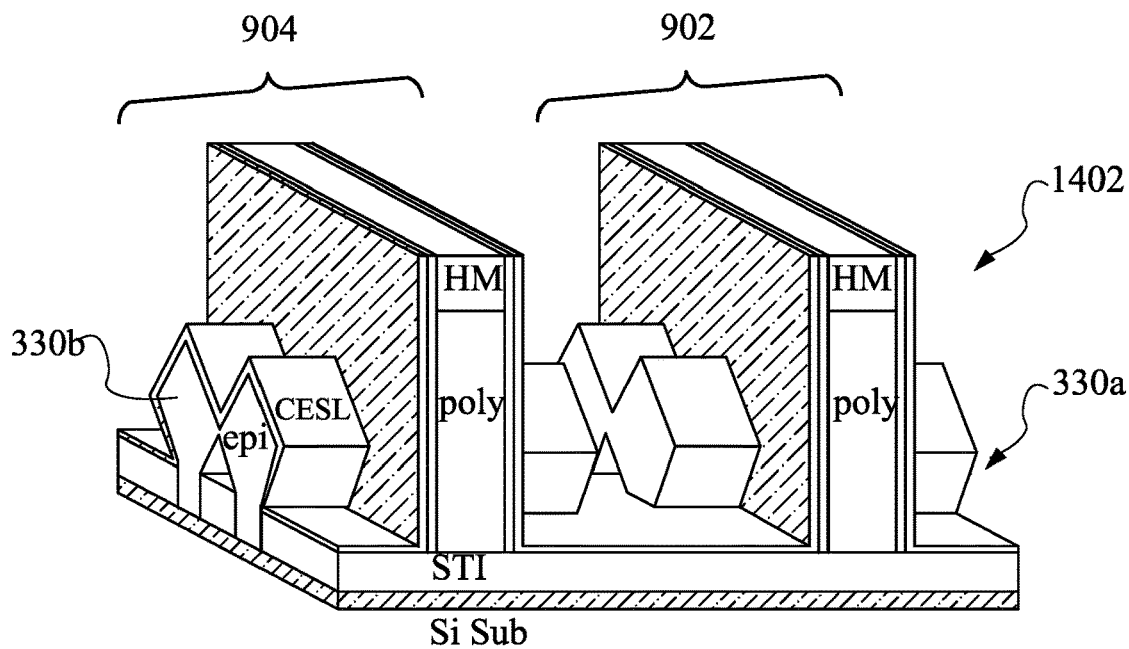

FIG. 14 is a perspective view of the n-type Fin FET device 902 and the p-type Fin FET device 904 at one of various stages of the sequential fabrication process according to an embodiment of the present disclosure. After forming the source/drain regions (e.g., the strain material 330a, the strain material 330b), an operation of depositing a contact etch stop layer 1402 (CESL) is performed. In this example, the CESL 1402 may be applied as a layer uniformly over the n-type Fin FET device 902 and the p-type Fin FET device 904.

Figure 15:
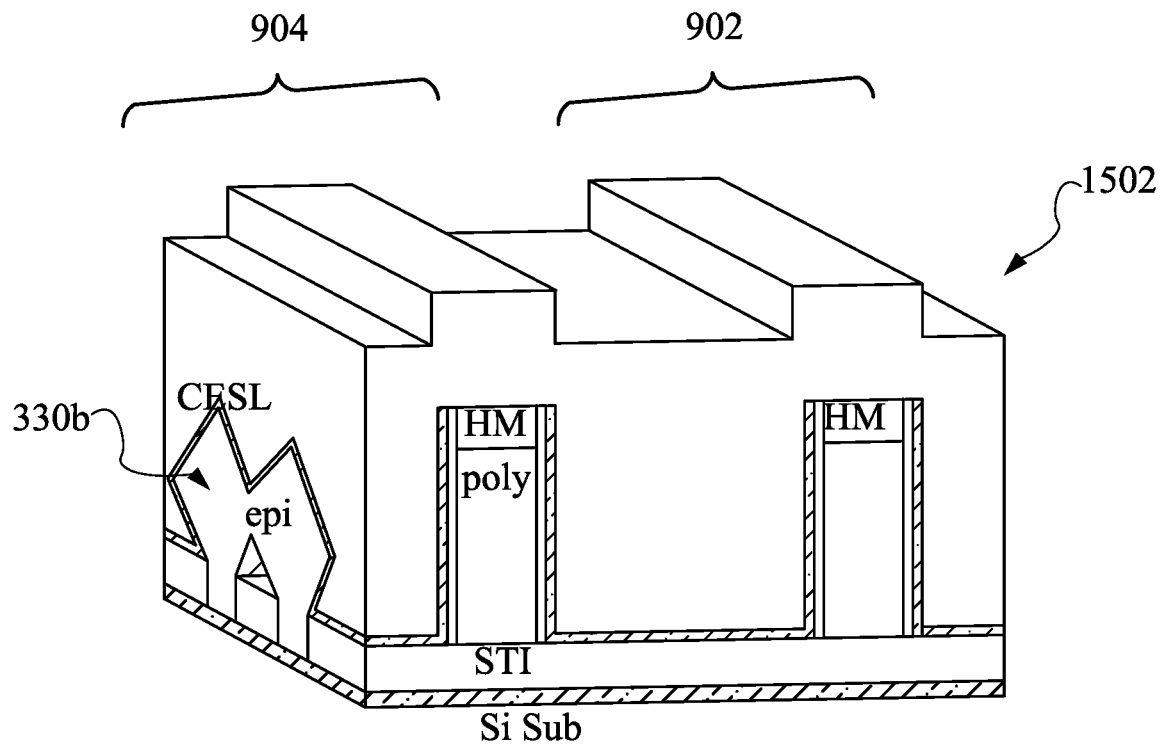

FIG. 15 is a perspective view of the n-type Fin FET device 902 and the p-type Fin FET device 904 at one of various stages of fabrication according to an embodiment of the present disclosure. The CESL operation (see, FIG. 14) is followed by an operation of depositing an interlayer dielectric (ILD) layer 1502. The ILD layer 1502 is deposited by a suitable technique, such as CVD. In this embodiment, the ILD layer 1502 is applied as a layer uniformly over the n-type Fin FET device 902 and the p-type Fin FET device 904. The ILD layer 1502 includes a dielectric material, such as one or more layers of silicon oxide, silicon nitride, a low-k dielectric material or a combination thereof.

Figure 16:
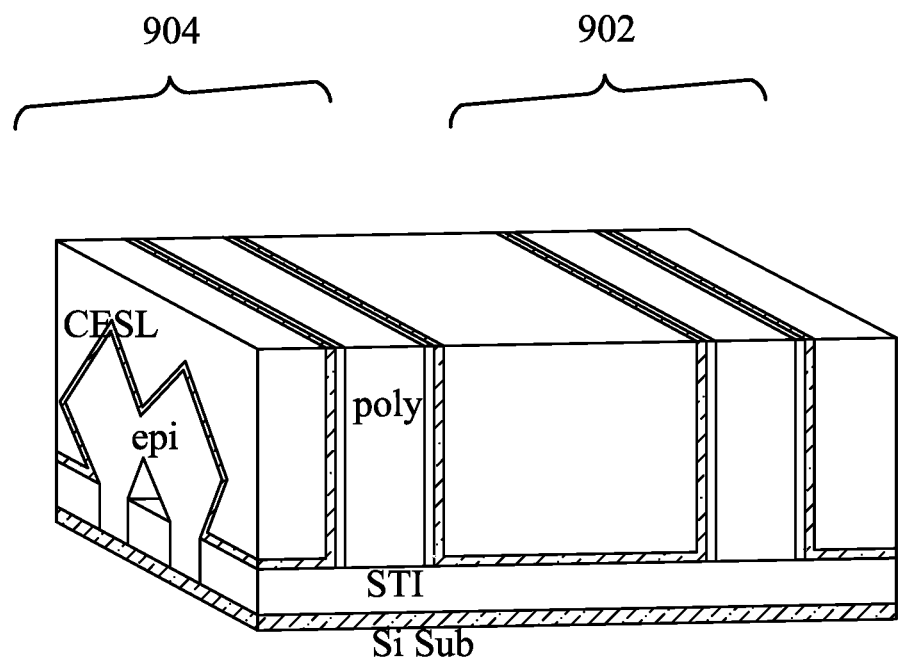

FIG. 16 is a perspective view of the n-type Fin FET device 902 and the p-type Fin FET device 904 at one of various stages of the sequential fabrication process according to an embodiment of the present disclosure. The ILD layer 1502 and the hard mask are subsequently planarized by a CMP operation, resulting in the structure shown in FIG. 16.

In embodiments of the disclosure, the source/drain electrodes (contacts) is formed by patterning the ILD layer 1502, such as a photolithographic operation to form openings exposing the strain material 330a and 330b. A suitable conductive material, such as copper, tungsten, nickel, titanium, or the like, is deposited in the openings. In some embodiments, a metal silicide is formed at the conductive material and source/drain interface to improve conductivity at the interface. In one example, a damascene and/or dual damascene operation is used to form copper-based multilayer interconnection structures. In another embodiment, tungsten is used to form tungsten plugs in the openings.

In this embodiment, an STI first/gate last method is implemented. Many of the operations in this embodiment are the same or similar to the operations of a STI first/gate first method. The methods are the same through the operation of removing a portion of the STI regions.

In order to use a high-k metal gate (HK/MG), an operation of depositing a dummy gate dielectric overlying the exposed end portions of the fins, an operation of depositing a dummy gate, and an operation of patterning the dummy gate are performed. After patterning the dummy gate, the next operations are the same or similar to the STI first/gate first method until after the operation of CMP of the ILD layer 1502.

Figure 17:
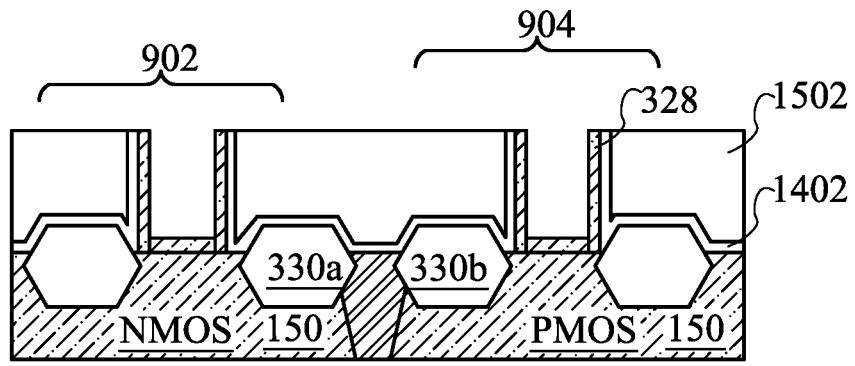

FIG. 17 is a cross-sectional view of the n-type Fin FET device 902 and the p-type Fin FET device 904 at one of various stages of the sequential fabrication process according to an embodiment of the present disclosure. After CMP of the ILD layer 1502, an operation of removing the dummy gate and an operation of removing the dummy gate dielectric are also performed. The dummy gate and dummy gate dielectric are removed using suitable etching operations.

Figure 18:
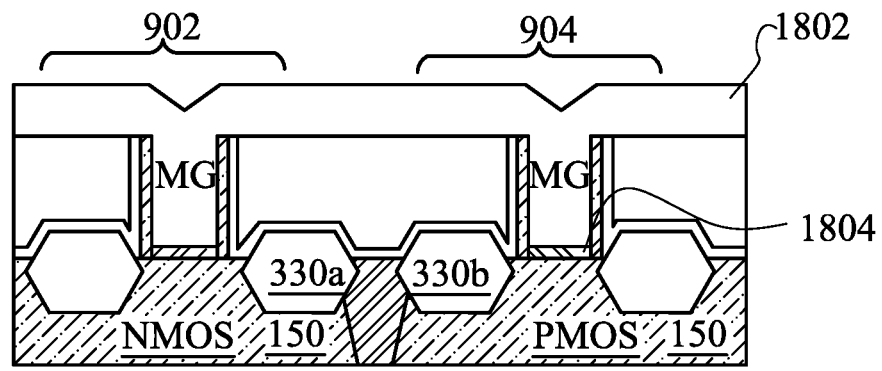

FIG. 18 is a cross-sectional view of the n-type Fin FET device 902 and the p-type Fin FET device 904 at one of various stages of the sequential fabrication process according to an embodiment of the present disclosure. Subsequently, an operation of depositing a high k metal gate 1802 (HK/MG) on a high k gate dielectric 1804 occurs. According to embodiments of the disclosure, the high k gate dielectric 1804 may include one or more layers of $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, or combinations thereof. The high k metal gate 1802 material may include one or more layers of Ti, TiN, titanium-aluminum alloy, Al, AlN, Ta, TaN, TaC, TaCN, TaSi, and the like.

Figure 19:
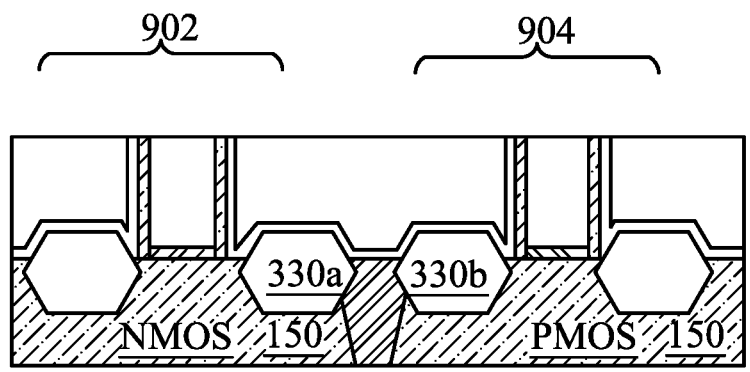

FIG. 19 is a cross-sectional view of the n-type Fin FET device 902 and the p-type Fin FET device 904 at one of various stages of the sequential fabrication process according to an embodiment of the present disclosure. After formation of the HK/MG electrode structure, the source/drain electrodes are patterned in a similar manner to the STI first/gate first method.

In other embodiments, a method for fabricating the Fin FET device 300 utilizes an EPI first/gate first method or EPI first/gate last method. In the EPI first methods, an epitaxial layer is formed on the substrate 110, and then the epitaxial layer is subsequently patterned to form fins (e.g., the semiconductor fins 120). Many of the operations in the EPI first embodiments are the same or similar to the operations of the STI first methods.

Subsequent processing according to embodiments of the present disclosure may also form various contacts/vias/lines and multilayer interconnect features (e.g., metal layers and interlayer dielectrics) on the semiconductor substrate 110, configured to connect the various features or structures of the Fin FET device 300. For example, a multilayer interconnection includes vertical interconnects, such as conventional vias or contacts, and horizontal interconnects, such as metal lines.

The Fin FET device 300 serves only as one example. The Fin FET device 300 may be used in various applications such as digital circuit, imaging sensor devices, a heterosemiconductor device, dynamic random access memory (DRAM) cell, a single electron transistor (SET), and/or other microelectronic devices (collectively referred to herein as microelectronic devices). Of course, aspects of the present disclosure are also applicable and/or readily adaptable to other type of transistor, including single-gate transistors, double-gate transistors, and other multiple-gate transistors, and may be employed in many different applications, including sensor cells, memory cells, logic cells, and others.

The present disclosure provides for the reduction of contact capacitance and increase in channel mobility for NMOS Fin FET structures by providing relatively heavy and shallow doping on a top surface of the phosphorus doped silicon-containing epitaxial layering. In particular, a phosphorus dimer (P2+) ion implantation is utilized after the epitaxial layering operation in order to effectively incorporate a higher chemical phosphorus concentration and amorphous level than the conventional phosphorus ion implantation under a same implantation dosage. The phosphorus dimer ion implantation may be, or may be a part of, a cryo-implantation with temperatures below −20° C. to induce a higher amorphous level (or lower activation energy).

In an embodiment, a method of fabricating a Fin FET device includes providing a substrate having a first fin structure and a second fin structure. The method includes forming an isolation layer on the substrate, in which the isolation layer is formed adjacent to the first fin structure and the second fin structure. The method includes forming a first gate structure on at least a portion of the first fin structure and the isolation layer. The method includes forming a second gate structure on at least a portion of the second fin structure and the isolation layer. The method includes forming a first strain material by an epitaxial growth operation, in which the first strain material provides stress to a channel region of the first fin structure. The method includes forming a second strain material by the epitaxial growth operation, in which the second strain material provides stress to a channel region of the second fin structure. The method also includes implanting a first doping agent to at least a first region of the first strain material, in which the first region has a first doping concentration of the first doping agent. In this embodiment, the first doping concentration is greater than a second doping concentration of a second doping agent in a second region of the first strain material. The method also includes applying a thermal anneal operation to at least the first fin structure and the first strain material, in which the channel region of the first fin structure has greater channel mobility than the channel region of the second fin structure, by at least the thermal anneal operation.

In another embodiment, a method of fabricating a Fin FET device includes providing a substrate having a fin structure. The method includes forming an isolation layer on the substrate, in which the isolation layer is formed adjacent to the fin structure. The method includes forming a gate structure on at least a portion of the fin structure and the isolation layer. The method includes forming a strain material by an epitaxial growth operation, in which the strain material provides stress to a channel region of the fin structure. The method includes implanting a first doping agent to at least a first region of the strain material, in which the first region has a first doping concentration of the first doping agent, and the first doping concentration being greater than a second doping concentration of a second doping agent in a second region of the strain material. The method also includes applying a thermal anneal operation to at least the fin structure and the strain material, in which the channel region of the fin structure has greater channel mobility than the channel region of a second fin structure on the substrate, by at least the thermal anneal operation.

In still another embodiment, a semiconductor device includes a substrate, a first fin structure and a second fin structure. The semiconductor device includes an isolation layer formed on the substrate, in which the isolation layer is formed adjacent to the first fin structure and the second fin structure. The semiconductor device includes a first gate structure formed on at least a portion of the first fin structure and the isolation layer. The semiconductor device includes a second gate structure formed on at least a portion of the second fin structure and the isolation layer. The semiconductor device includes a first epitaxial layer including a first strained material that provides stress to a channel region of the first fin structure. The semiconductor device includes a second epitaxial layer including a second strained material that provides stress to a channel region of the second fin structure, in which the second epitaxial layer has a first region and a second region. The first region has a first doping concentration of a first doping agent and the second region has a second doping concentration of a second doping agent. In this embodiment, the first doping concentration is greater than the second doping concentration.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a first fin having a first channel region and a second fin having a second channel region disposed over a substrate;
    a first epitaxial layer including a first strained material adjacent to the first fin; and
    a second epitaxial layer including a second strained material adjacent to the second fin,
    wherein the second epitaxial layer has a first region and a second region, the second region being located closer to the substrate than the first region,
    the first region has a first doping concentration of a first dopant of greater than $1 \times 10^{22}$ atoms/cm$^3$.

2. The semiconductor device of claim 1, wherein the first epitaxial layer comprises SiGe.

3. The semiconductor device of claim 1, wherein the second epitaxial layer comprises SiP or SiC.

4. The semiconductor device of claim 1, wherein the first dopant is a phosphorous dimer dopant.

5. The semiconductor device of claim 1, wherein the second region has a second doping concentration of a second dopant wherein the second doping concentration is less than the first doping concentration.

6. The semiconductor device of claim 5, wherein the second doping concentration ranges from $1 \times 10^{15}$ atoms/cm$^3$ to $4 \times 10^{15}$ atoms/cm$^3$.

7. The semiconductor device of claim 5, wherein the second dopant is a phosphorous dopant.

8. A fin field-effect transistor (Fin FET) semiconductor device, comprising:
    a substrate;
    a first fin structure having a channel region;
    a second fin structure having a channel region;
    a first epitaxial layer including a first strained material that provides stress to the channel region of the first fin structure; and
    a second epitaxial layer including a second strained material that provides stress to the channel region of the second fin structure,
    wherein the second epitaxial layer has a first region and a second region, the first region being located closer to a surface of the second epitaxial layer than the second region,
    the first region has a first doping concentration of a first dopant of greater than $1 \times 10^{22}$ atoms/cm$^3$ and the second region has a second doping concentration of a second dopant in a range from $1 \times 10^{15}$ atoms/cm$^3$ to $4 \times 10^{15}$ atoms/cm$^3$,
    wherein the first dopant has a first lateral variance and the second dopant has a second lateral variance, and wherein the first lateral variance is greater than the second lateral variance.

9. The semiconductor device of claim 8, wherein the first epitaxial layer comprises SiGe.

10. The semiconductor device of claim 8, wherein the second epitaxial layer comprises SiP or SiC.

11. The semiconductor device of claim 8, wherein the first dopant is a phosphorous dimer dopant.

12. The semiconductor device of claim 8, wherein the second dopant is a phosphorous dopant.

13. A fin field-effect transistor(FIN FET) semiconductor device, comprising:
    a substrate;
    a first fin structure having a channel region;
    a second fin structure having a channel region;
    a first epitaxial layer including a first strained material that provides stress to the channel region of the first fin structure; and
    a second epitaxial layer including a second strained material that provides stress to the channel region of the second fin structure,
    wherein the second epitaxial layer has a first region and a second region, the first region being located closer to a surface of the second epitaxial layer than the second region,
    wherein the first region has a first doping concentration of a first dopant and the second region has a second doping concentration of a second dopant,
    wherein the first doping concentration is greater than $1 \times 10^{22}$ atoms/cm$^3$, and wherein a thickness of the first region from a surface of the second epitaxial layer to the second region ranges from 0.1 nm to 8 nm.

14. The semiconductor device of claim 13, wherein the first dopant is a phosphorous dimer dopant.

15. The semiconductor device of claim 13, wherein the second dopant is a phosphorous dopant.

16. The semiconductor device of claim 13, wherein the first epitaxial layer comprises SiGe.

17. The semiconductor device of claim 13, wherein the second epitaxial layer comprises SiP or SiC.

18. The semiconductor device of claim 13, wherein a thickness of the second region ranges from 25 nm to 60 nm.

19. The semiconductor device of claim 13, wherein the first region is an uppermost epitaxial region of the second epitaxial layer.

20. The semiconductor device of claim 13, wherein the second doping concentration is less than the first doping concentration.

* * * * *